(12) United States Patent
Schmid

(10) Patent No.: US 6,556,164 B2
(45) Date of Patent: Apr. 29, 2003

(54) ANALOG/DIGITAL CONVERTER AND METHOD FOR CONVERTING AN ANALOG INPUT SIGNAL INTO A DIGITAL OUTPUT SIGNAL

(75) Inventor: Harald Schmid, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/209,385

(22) Filed: Jul. 29, 2002

(65) Prior Publication Data

US 2003/0034910 A1 Feb. 20, 2003

Related U.S. Application Data

(63) Continuation of application No. PCT/DE00/04638, filed on Dec. 21, 2000.

(30) Foreign Application Priority Data

Jan. 28, 2000 (DE) .......................... 100 03 701

(51) Int. Cl.[7] .............................. H03M 1/44; H03M 1/12
(52) U.S. Cl. ....................... 341/163; 341/161; 341/155
(58) Field of Search ................................ 341/155, 161, 341/162, 163

(56) References Cited

U.S. PATENT DOCUMENTS

| 3,781,871 A | | 12/1973 | Mattern | |
| 4,314,235 A | | 2/1982 | Ruf et al. | |
| 4,641,246 A | * | 2/1987 | Halbert et al. | 341/163 |
| 4,883,987 A | | 11/1989 | Fattaruso | |
| 6,154,164 A | * | 11/2000 | Gross, Jr. | 341/163 |
| 6,154,165 A | * | 11/2000 | Gross, Jr. | 341/164 |

OTHER PUBLICATIONS

Mercer, D. et al.: "8–Bit a–d Converter Mates Transducers With $\mu$Ps", Electronic Design, vol. 32, No. 1, Jan. 12, 1984, pp. 361–367.

* cited by examiner

*Primary Examiner*—Howard L. Williams
(74) *Attorney, Agent, or Firm*—Laurence A. Greenberg; Werner H. Stemer; Gregory L. Mayback

(57) ABSTRACT

An analog-to-digital converter for successively and approximately converting an analog input signal into a digital output signal includes at least one comparator having a linear input module and an output module. The analog input signal is compared with a compare signal supplied by a digital-to-analog converter and supplies a comparator output signal for adjusting a clocked successive approximation register. The digital value temporarily stored in the successive approximation register is converted into the analog compare signal by the digital-to-analog converter. The inventive converter also includes an acceleration circuit supplying a reversible clock signal to the cocked successive approximation register according to at least one overload detector signal that detects overload of an appurtenant linear input module in the comparator.

16 Claims, 4 Drawing Sheets

ANALOG/DIGITAL CONVERTER AND METHOD FOR CONVERTING AN ANALOG INPUT SIGNAL INTO A DIGITAL OUTPUT SIGNAL

CROSS-REFERENCE TO RELATED APPLICATION

This application is a continuation of copending International Application No. PCT/DE00/04638, filed Dec. 21, 2000, which designated the United States and was not published in English.

BACKGROUND OF THE INVENTION

Field of the Invention

The invention relates to an analog/digital converter for successive approximation conversion of an analog input signal into a digital output signal at an increased conversion rate. Analog/digital converters are electronic circuits that convert an analog input signal into a digital output signal. In the successive approximation method, the data bits of the digital output signal are successively determined one after the other in successive approximation steps. To such an end, the analog/digital converter is provided with a comparator, a digital/analog converter DAC, a successive approximation register SAR, and a logic circuit. The successive approximation method first involves setting the most significant bit MSB and then using the digital/analog converter DAC to ascertain the associated value of an analog voltage. If the input analog voltage to be converted is greater than the ascertained output analog voltage of the digital/analog converter DAC, then the set bit remains set and, in the converse case, it is reset. The next less significant bit is then set and the digital/analog converter DAC is used to generate the associated analog output voltage from the corresponding digital value. The analog output voltage so formed is compared with the-analog input-voltage that is to be converted, and the comparator is then used to decide whether or not the set bit can remain set. The method is continued in this manner until all the bits of the binary-coded digital/analog converter have been ascertained successively. In the case of such analog/digital converters based on the prior art, the conversion rate depends primarily on the speed of the comparator. The comparator has a multistage configuration. The comparator generally contains at least one linear input stage for linear amplification of an analog input signal using a relatively low gain and also at least one output stage with a relatively high gain.

The time limits substantially determining the conversion rate of the analog/digital converter are prescribed firstly by the recovery time of the comparator following overdriving of the linear input stage and secondly by the minimum switching time of the comparator at a low drive level.

Because the data bits of the digitally converted value are ascertained successively, the conversion rate is lower than that of a parallel converter, and an increase in speed or an increase in the conversion rate is particularly desirable for an analog/digital converter using successive approximation.

SUMMARY OF THE INVENTION

It is accordingly an object of the invention to provide an analog/digital converter for successive approximation conversion of an analog input signal into a digital output signal and method for converting an analog input signal into a digital output signal that overcome the hereinaforementioned disadvantages of the heretofore-known devices and methods of this general type and that performs the successive approximation conversion at an increased conversion rate.

With the foregoing and other objects in view, there is provided, in accordance with the invention, an analog/digital converter for successive approximation conversion of an analog input signal into a digital output signal, including a clocked successive approximation register buffer storing a digital value, a digital/analog converter converting the digital value buffer-stored in the register to form an analog comparison signal, the digital/analog converter connected to the register and outputting the analog comparison signal, at least one comparator having at least one linear input stage connected to the digital/analog converter and an output stage, the at least one comparator comparing the analog input signal with the analog comparison signal, outputting a comparator output signal for setting the register and at least one overdrive indicator signal, and indicating with the at least one overdrive indicator signal an overdriving of the at least one linear input stage, an acceleration circuit connecting the at least one comparator to the register, the acceleration circuit outputting a switchable clock signal to the register based upon the at least one overdrive indicator signal.

The idea on which the inventive analog/digital converter is based is that of detecting the overdriving of the linear input stages of the comparator and of clocking the successive approximation register on the basis thereof.

In such case, the overdriving does not absolutely need to be detected very accurately.

In accordance with another feature of the invention, the linear input stage contains a differential amplifier circuit and an overdrive detection circuit for detecting the overdriving of the differential amplifier.

In accordance with a further feature of the invention, the at least one linear input stage is a plurality of linear input stages and each of the linear input stages respectively have a differential amplifier circuit and an overdrive detection circuit for detecting an overdriving of the differential amplifier circuit.

In accordance with an added feature of the invention, the overdrive detection circuit is a window discriminator.

The input side of the acceleration circuit is preferably connected to a clock generator.

In accordance with an additional feature of the invention, the acceleration circuit has a pulse generator, downstream of whose output side there are a first delay element for delaying the generated pulse by the recovery time of the comparator and a second delay element for delaying the generated pulse by the maximum decision time of the comparator, the signal outputs of the two delay elements being connected to a controlled switching device that connects the signal outputs of the delay elements to the successive approximation register based upon the overdrive indicator signal.

In accordance with yet another feature of the invention, the switching device is preferably a multiplexer.

In accordance with yet a further feature of the invention, the pulse generator is preferably a flip-flop, in particular, a D-type flip-flop. In such case, the output of the multiplexer is preferably coupled to the flip-flop.

In accordance with yet an added feature of the invention, the multiplexer has an output, the pulse generator is a D-type flip-flop, and the output of the multiplexer is fed back to the D-type flip-flop.

In accordance with yet an additional feature of the invention, there is provided a clock generator connected to the acceleration circuit, the pulse generator, the first delay element, and the second delay element being clocked synchronously by the clock generator.

In accordance with again another feature of the invention, there is provided a read register connected to the register for reading a digitized final value from the register.

In accordance with again a further feature of the invention, the overdrive detection circuit preferably detects the level and the arithmetic sign of the overdriving of the differential amplifier.

In accordance with again an added feature of the invention, the clock signal can be switched over by the acceleration circuit between a first clock signal having a minimum clock period and a second clock signal having a maximum clock period.

In accordance with again an additional feature of the invention, the minimum clock period corresponds to the recovery time of the comparator, and the maximum clock period corresponds to the;maximum required decision time of the comparator.

In accordance with still another feature of the invention, the minimum clock period can be set externally as the delay of the first delay element, and the maximum clock period can be set externally as the delay of the two delay elements.

With the objects of the invention in view, there is also provided a method for converting an analog input signal into a digital output signal, having the following steps:
 (a) the analog input signal is compared with an analog comparison signal, which corresponds to a digital value buffer-stored in a clocked successive approximation register, by a comparator;
 (b) a comparator output signal is formed based upon the comparison result to set the buffer-stored digital value in the successive approximation register;
 (c) detecting if a linear input stage of the comparator is overdriven; and
 (d) a clock signal for the clocked successive approximation register is switched over to a first clock signal having a minimum clock period if overdriving is detected and to a second clock signal having a maximum clock period if no overdriving is detected.

Other features that are considered as characteristic for the invention are set forth in the appended claims.

Although the invention is illustrated and described herein as embodied in an analog/digital converter, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
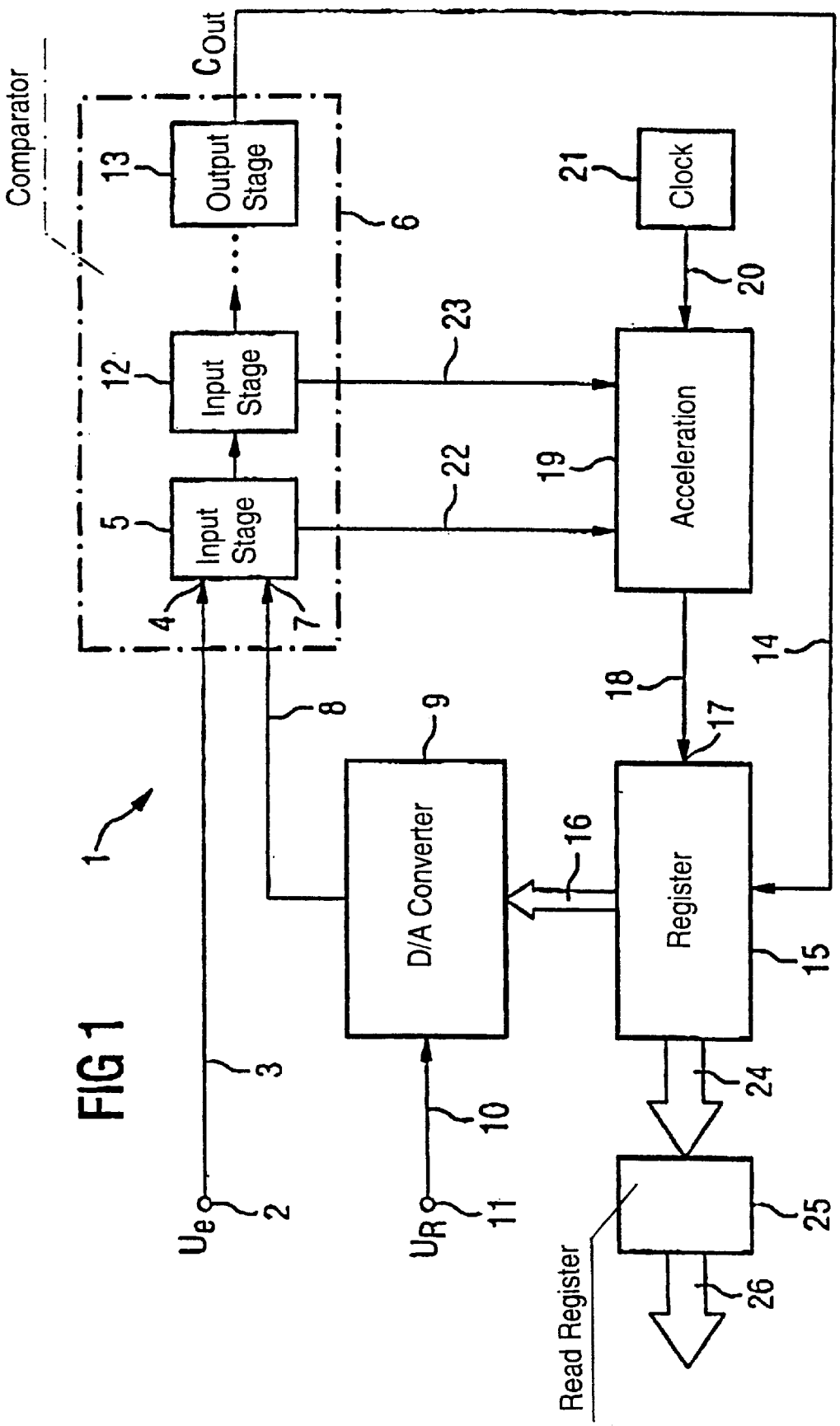
FIG. 1 is a block circuit diagram of a preferred embodiment of an analog/digital converter according to the invention.

Referring now to the figures of the drawings in detail and first, particularly to FIG. 1 thereof, there is shown a block circuit diagram of the inventive analog/digital converter for successive approximation conversion of an analog input signal into a digital output signal.

The inventive analog/digital converter 1 has an analog input connection 2 for applying the analog input signal that is to be converted. The analog input signal connection 2 is connected by a line 3 to a first input 4 of an analog input stage 5 of a comparator 6. The analog first input stage 5 of the comparator 6 has a second analog input 7, which is connected to a digital/analog converter 9 by a signal line 8. The digital/analog converter 9 receives through a line 10 and a reference voltage connection 11 a reference voltage $U_R$ for performing the digital/analog conversion. The comparator 6 has a plurality of series-connected amplification stages 5, 6, 12 and also at least one output stage 13 for amplifying the comparator output signal $C_{out}$. The comparator output signal $C_{out}$ is written to a clocked successive approximation register 15 through a signal line 14. The digital value written to the successive approximation register 15 is passed through data lines 16 to the digital/analog converter 9, which converts the digital value contained in the successive approximation register 15 into an analog voltage that is applied through the analog signal line 8 to the input 7 of the first linear amplification stage 5 of the comparator 6.

The successive approximation register 15 has a clock input 17 that is connected to an acceleration circuit 19 by a clock line 18. The input side of the acceleration circuit 19 is connected to a clock generator 21 by a clock line 20. In addition, the acceleration circuit holds over control indicator signals from the linear input stages 5, 12 of the comparator 6 through control indicator signal lines 22, 23. The control indicator signals indicate overdriving of the associated linear input stage 5, 12 in the comparator 6.

The digital value contained in the successive approximation register 15 is written to a read register 25 through digital read lines 24 when analog/digital conversion has been performed. The converted output value held in the read register 25 can then be read through read lines 26. In such a case, the digital value that is read corresponds to the analog input signal $U_E$.

The conversion rate of the analog/digital converter 1 shown in FIG. 1 depends primarily on the speed of the comparator 6. At a low drive level for the linear input stages 5, 12, the comparator 6 can decide within a decision switching time whether the bit that was last set in the successive approximation register 9 remains set or is reset.

At a high drive level for the first linear input stage 5 or for the linear input stages 5, 12 of the comparator 6, however, it is not necessary to wait the entire decision switching time of the comparator 6, but rather the decision can actually be evaluated as soon as the overdriving of an input stage of the comparator 6 is detected. At a high drive level for the linear input stage 5, i.e., with a high differential voltage between the input connections 4, 7 of the linear input stage 5, the linear input stage 5 is overdriven after only a very short time. If one of the front linear input stages 5, 12 of the comparator 6 is overdriven, then the comparator output signal can be evaluated immediately and the next successive approximation step can be performed. When the Linear input stage 5, 12 is overdriven, the time period for the decision by the comparator 6 can be shortened to the recovery time after overdriving and a possible additional short safety time.

The linear input stage 5, 12 of the comparator 6 is overdriven by an overdrive detection circuit that is incorporated in the linear input stages and whose output side outputs a respective overdrive indicator signal to the acceleration circuit 19 through the overdrive detection lines 22, 23. The acceleration circuit 19 uses the clock line 18 of the successive approximation register 15 for clocking. The input side of the acceleration circuit 19 is connected to a clock generator 21 through the clock line 20. When the acceleration circuit 19 receives, through the overdrive indicator signal lines 22, 23, an overdrive indicator signal indicating overdriving of associated linear input stages 5, 12 in the comparator 6, the clock frequency of the clock signal that is on the clock line 18 is increased to clock the successive approximation register 15. In such a case, only the recovery time after overdriving is waited.

When, conversely, the acceleration circuit 19 receives no overdrive indicator signals through the lines 22, 23 from the linear input stages 5, 12 of the comparator 6, the acceleration circuit 19 applies to the clock line 18 a clock signal having a relatively low clock frequency for clocking the successive approximation register 15. Such a relatively low clock frequency corresponds to the required maximum decision time of the comparator 6.

Figure 2:
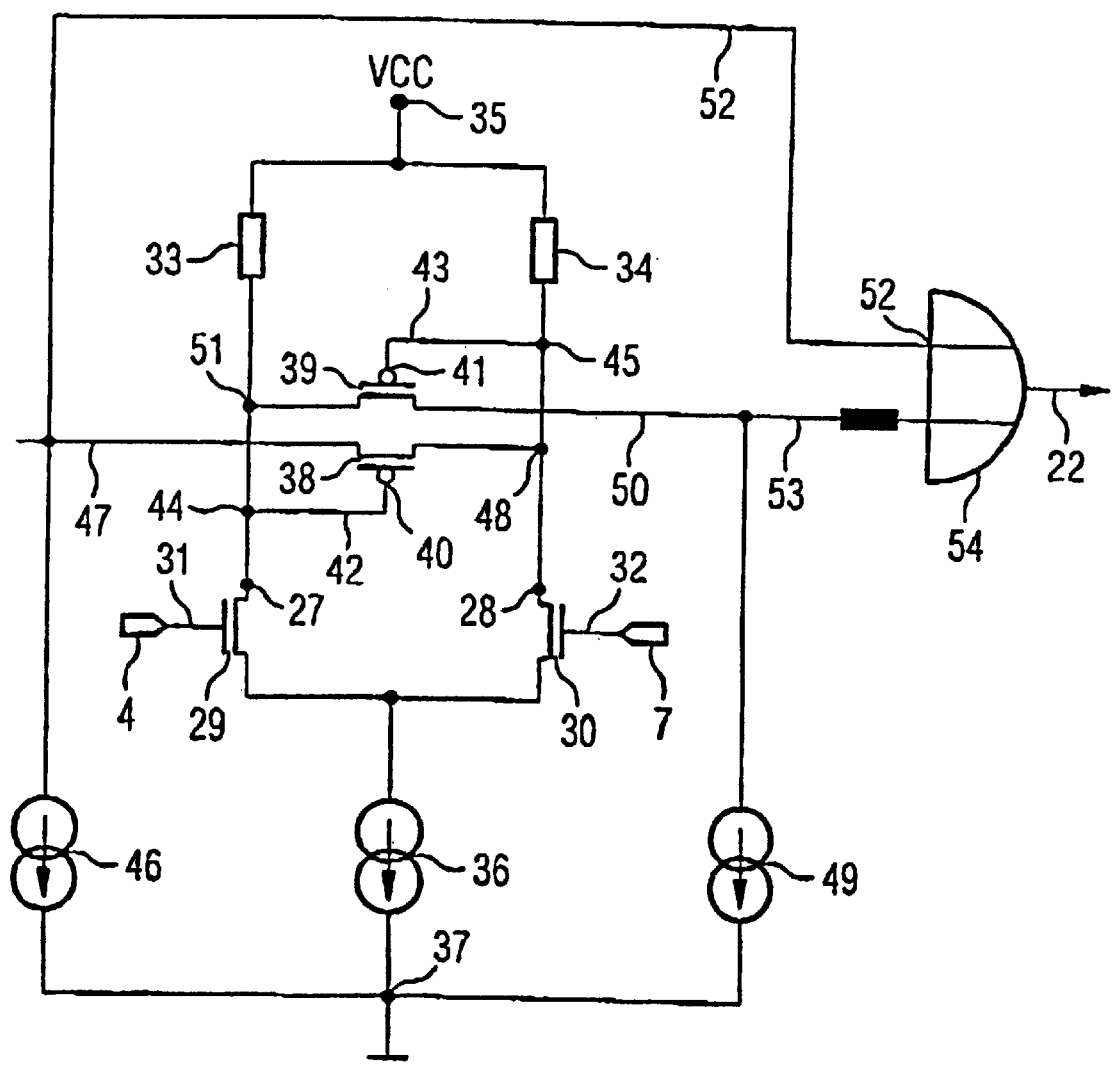
FIG. 2 is a block and schematic circuit diagram of a preferred embodiment of a comparator in the analog/digital converter of FIG. 1.

FIG. 2 shows a linear input stage 5, 12 for the comparator 6 in the inventive analog/digital converter 1 as shown in FIG. 1.

The linear input stage 5 contains a differential amplifier circuit and an overdrive detection circuit for detecting overdriving of the differential amplifier circuit. The differential amplifier circuit includes two differential amplifier transistors 27, 28, whose gate connections 29, 30 are connected through lines 31, 32 to the two analog signal inputs 4, 7 of the linear input amplifier stage 5 of the comparator 6. In such a case, the differential transistors 27, 28 are preferably MOSFET transistors. The differential transistors 27, 28 are connected series with load resistors 33, 34 that are connected to a supply voltage connection 35. In addition, the differential amplifier circuit contains a differential amplifier current source 36 that draws the associated load resistor 33, 34 to a ground connection 37 when the differential transistor 27, 28 is on.

In addition, the linear input stage 5 shown in FIG. 2 contains an overdrive detection circuit connected to the differential amplifier circuit. The overdrive detection circuit includes detection transistors 38, 39 whose gate connections 40, 41 are connected through lines 42, 43 to branch potential nodes 44, 45 between a load resistor 33, 34 and the associated differential amplifier 27, 28. In the embodiment shown in FIG. 2, the detection transistors 38, 39 are each P-channel MOSFETs. In addition, the overdrive detection circuit contains a current source 46 that is connected through a line 47 and the detection transistor 38 to a branch potential node 48 between the load resistor 34 and the differential transistor 28. Symmetrically with respect thereto, a further current source 49 for the overdrive detection circuit is provided, which is connected by a line 50 through the detection transistor 39 to a branch potential node 51 situated between the load resistor 33 and the differential transistor 27.

As soon as the differential voltage signal between the analog signal inputs 4, 7 of the differential amplifier circuit exceeds a certain prescribed threshold value, one of the two detection transistors 38, 39 turns on, depending on the arithmetic sign of the overdriving. This opens the current path from the voltage supply connection 35 through the load resistor 33 and the current source 49 to the ground connection 37, or opens the current path from the voltage supply connection 35 through the load resistor 34 and the current source 46 to the ground connection 37. The turning-on of the detection transistor 38 is detected through a line 52, and the turning-on of the detection transistor is detected through a line 53. The two lines 52, 53 are ORed in an OR gate 54 that outputs an overdrive indicator signal indicating the overdriving of the linear input stage to the acceleration circuit 19 through the overdrive indicator line 22. As soon as the overdriving of the linear input stage exceeds a particular place value, an overdrive indicator signal is output to the acceleration circuit 19 through the line 22.

The overdrive detection circuit shown in FIG. 2 works as a window discriminator. As a result, the overdriving is detected particularly quickly.

Figure 3:
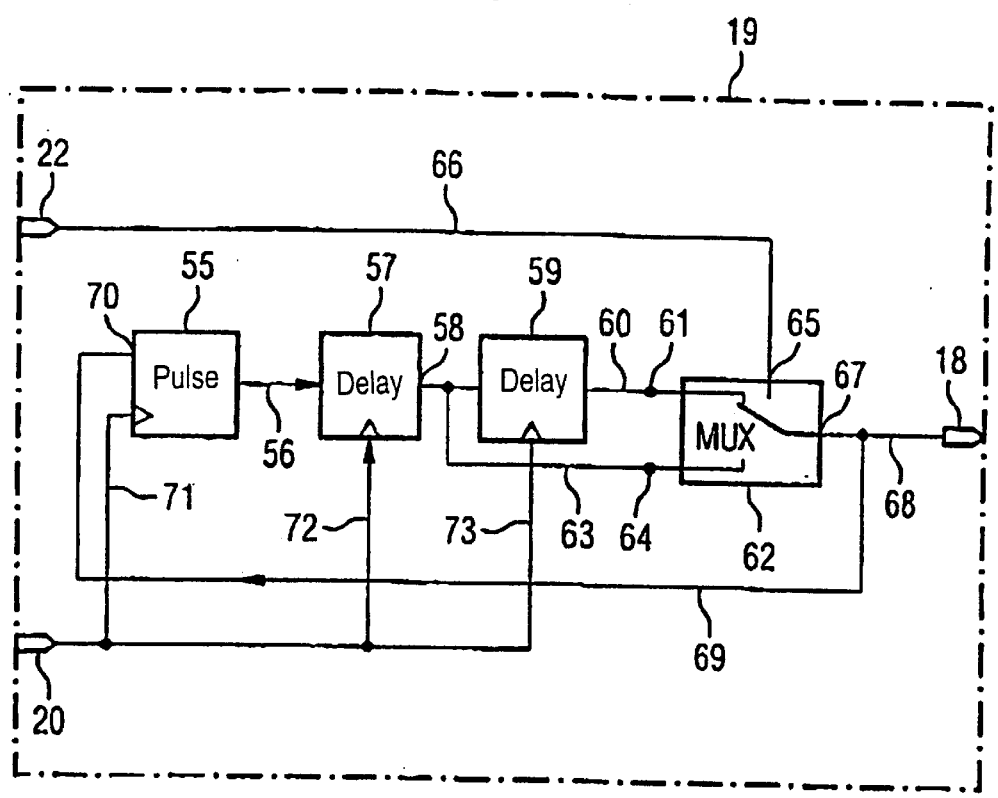
FIG. 3 is a block circuit diagram of a preferred embodiment of the acceleration circuit in the analog/digital converter of FIG. 1.

FIG. 3 shows a preferred embodiment of the acceleration circuit 19 in the inventive analog/digital converter 1. The acceleration circuit 19 contains a pulse generator 55 whose output side is connected to a first delay element 57 through an internal line 56. A second delay element 59 is connected in series with the first delay element through an internal line 58. The second delay element 59 is connected to the first input 61 of a switching device 62 through a line 60. The connecting line 58 between the first delay element 57 and the second delay element 59 is connected to a second input 64 of the switching device 62 through a line 63.

The switching device 62 has a control connection 65 that controls switching between the first input 62 and the second input 61 of the switching device 62. The control connection 65 is connected to the overdrive indicator signal line 22 through a control line 66. The switching device 62 is preferably a multiplexer whose output 67 is connected through a line 68 to the clock signal line 18, which supplies a clock signal to the analog successive approximation register 15. The output 67 of the multiplexer 62 is also connected to an input 70 of the pulse generator 55 through a feedback line 69. The pulse generator 55 and the two delay elements 57, 59 are clocked synchronously through clock lines 71, 72, 73 that are connected to the clock generator 21 through the clock line 20. The pulse generator 55 is, by way of example, a D-type flip-flop action whose control input 70 is connected to the output 67 of the multiplexer through the feedback line. The first delay element 57 delays the pulse generated by the pulse generator 55 by a time that corresponds to the recovery time of the comparator 6 with regard to overdriving.

The second delay element 59 then additionally delays the pulse generated by the pulse generator 55 to the extent that the delay corresponds to the decision time of the comparator 6. When there is an overdrive indicator signal on the line 66, the multiplexer 62 is switched such that the input 64 is connected directly to the output 67 of the multiplexer.

In such a switching position, the pulse generated by the pulse generator 55 is delayed merely by the recovery time of the comparator 6 using the delay element 57. As a result, the acceleration circuit 19 uses the clock line 18 to output a clock signal having a short clock period, which corresponds to the recovery time of the comparator 6.

If, conversely, there is no overdrive indicator signal on the overdrive indicator signal line 22, then the multiplexer 62 switches to the opposite switching position, i.e., the input 61 is connected to the output 67. As a result, the pulses generated by the pulse generator 55 are delayed by both delay elements 57, 59, with the time delay being set such that it corresponds to the required decision time of the comparator 6. As a result, the acceleration circuit 19 uses the clock line 18 to output a second clock signal having a long clock period to the successive approximation register 15, the long clock period corresponding to the required decision time of the comparator 6. The delays of the two delay elements 57, 59 can be set as appropriate using non-illustrated setting lines.

Hence, when overdriving occurs at one of the linear input stages 5, 12 of the comparator 6, the clock-frequency of the clock signal for clocking the successive approximation register 15 is increased as appropriate, and, hence, the conversion rate of the inventive analog/digital converter 1 is. increased overall. In such a case, the clock period of the accelerated clock signal corresponds to the recovery time of the comparator 6 with regard to overdriving that has occurred.

Figure 4:
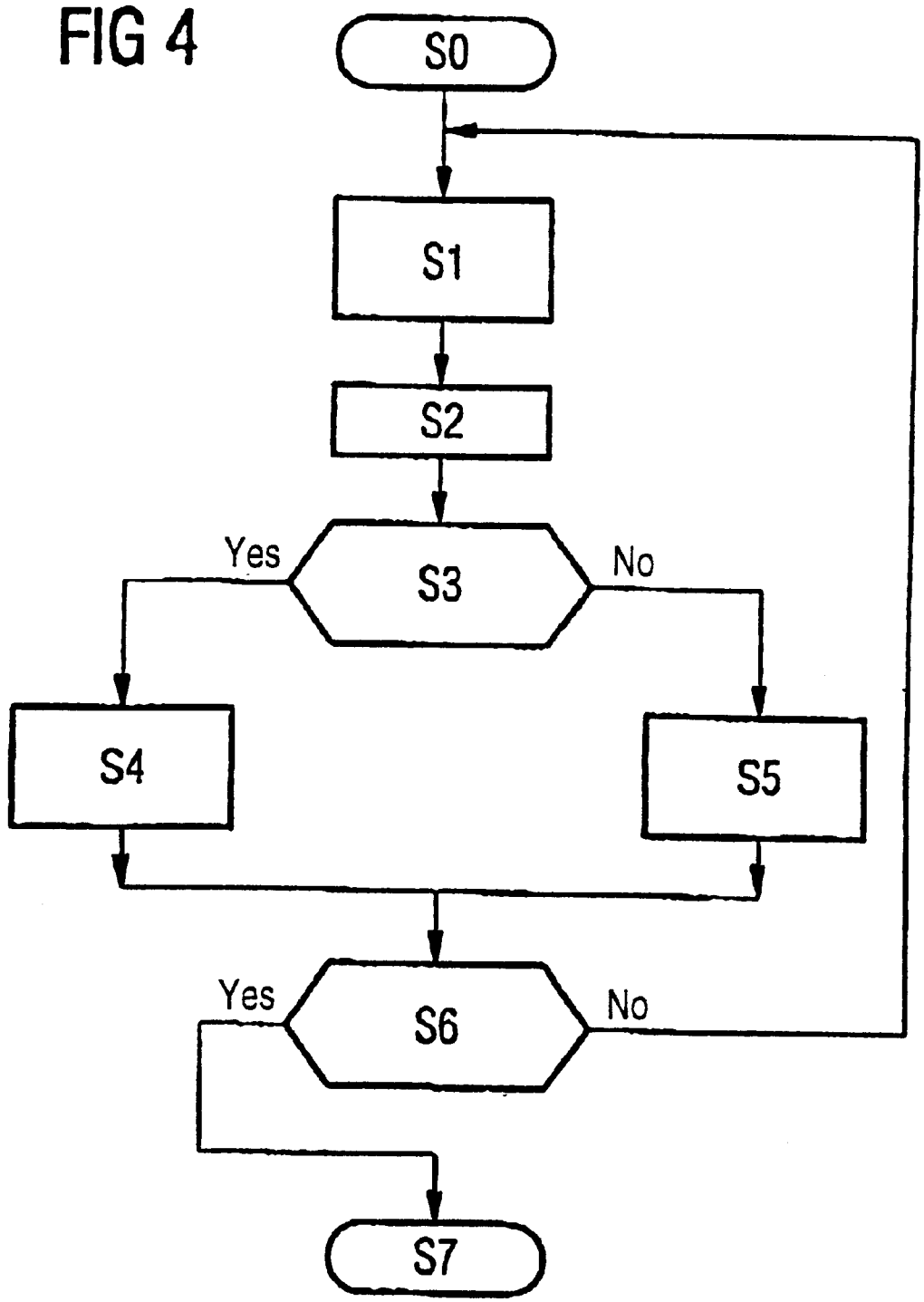
FIG. 4 is a simplified flowchart illustrate the method for converting an analog signal into a digital output signal according to the invention.

FIG. 4 shows a flowchart for the inventive method for converting an analog input signal into a digital output signal.

After a start step S0, a bit is first subjected to digital conversion in step S1, starting with the most significant bit MSB.

In a step S2, the overdrive indicators are read in by the acceleration circuit 19.

In a step S3, a decision is made as to whether or not the linear input stage 5 of the comparator 6 is overdriven.

If the linear input stage 5 is found to be overdriven in step S3, the acceleration circuit 19 uses the line 18 to output a clock signal to the successive approximation register 15, with the clock period corresponding to the recovery time of the comparator 6 with regard to overdriving.

If, conversely, the linear input stage 5 is not found to be overdriven in step S3, the acceleration circuit 19 outputs a clock signal to the successive approximation register 15 through the clock signal line 18 in step S5, with the clock period of the clock signal corresponding to the normal required decision time of the comparator 6.

When steps S4, S5 have been performed, a decision is made in step S6 as to whether or not the least significant bit LSB has already been converted. If the least significant bit has already been converted, the procedure is ended in step S7. If the least significant bit has not yet been converted, the procedure returns to step S1.

The procedure shown in simple form in FIG. 4 can be extended only in cascade form by taking into account overdrive indicator signals from further input stages of the comparator 6. In such a case, by way of example, the overdriving of the first and second linear comparator input stages could be evaluated. If the first linear input stage 5 is overdriven, the clock period is shortened more severely than in an operating state in which only the second linear input stage 12 is overdriven.

By evaluating the various overdrive indicator signals from the linear input stages 5, 12 of the comparator 6, which are connected in series one behind the other, it is possible to-set the clock period of the clock signal that is output to the successive approximation register 15 by the acceleration circuit 19 in optimum fashion so that the highest possible conversion rate is achieved. The conversion time of the analog/digital converter 1 can be severely shortened depending on the resolution of the analog/digital converter 1 and depending on the properties of the comparator 6.

In such a context, the conversion time can be shortened to the maximum extent by using the evaluation of the overdrive indicator signals by the acceleration circuit 19 also to limit the first linear comparator input stage 5 and to reset the comparator 6. Such a configuration minimizes the recovery time after overdriving has occurred.

In the method in accordance with the invention, the input signal to be converted, which is applied to the analog signal input 2 of the comparator 6, is compared with the comparison signal that is on the line 8 and corresponds to a digital value buffer-stored in the successive approximation register 15. Based upon the comparison result, the comparator 6 forms a comparator output signal $C_{out}$ for setting the buffer-stored digital value in the successive approximation register 15. The acceleration circuit 19 uses the overdrive indicator signal lines 22, 23 to ascertain whether or not a linear input stage 5, 12 of the comparator 6 is overdriven. If the acceleration circuit 19 detects overdriving, a clock signal having a short clock period is output through the clock signal line 18 to clock the successive approximation register 15. If, conversely, the acceleration circuit 19 detects no overdriving, a second clock signal having a relatively long clock period is output through the clock signal line 18 to clock the successive approximation register 15. In such a case, the short clock period corresponds to the recovery time of the comparator 6 with regard to overdriving, and the relatively long clock period corresponds to the normal required decision time of the comparator 6.

During a conversion, the full resolution of the comparator 6 is needed only for a single successive approximation step. In all other successive approximation steps, the comparator 6 is overdriven to a greater or lesser extent, i.e., in the comparator a signal from at least one LSB drive level is supplied. The overdriving does not need to be detected particularly accurately per se. In such a case, it is necessary merely to detect if overdriving occurs, but not the level of the overdriving. During conversion, the minimum differential voltage occurs at the input of the comparator 6 for one bit only. For all further data bits, the comparator 6 is overdriven to a greater or lesser extent, with the digital/analog converter 9 ultimately switching in LSB steps or multiples thereof.

I claim:

1. An analog/digital converter for successive approximation conversion of an analog input signal into a digital output signal, comprising:

a clocked successive approximation register buffer storing a digital value;

a digital/analog converter converting said digital value buffer-stored in said register to form an analog comparison signal, said digital/analog converter connected to said register and outputting said analog comparison signal;

at least one comparator having:
at least one linear input stage connected to said digital/analog converter; and
an output stage;

said at least one comparator:
comparing the analog input signal with said analog comparison signal;
outputting:
a comparator output signal for setting said register; and
at least one overdrive indicator signal; and
indicating with said at least one overdrive indicator signal an overdriving of said at least one linear input stage; and an acceleration circuit connecting said at least one comparator to said register, said acceleration circuit outputting a switchable clock signal to said register based upon said at least one overdrive indicator signal.

2. The analog/digital converter according to claim 1, wherein:
said at least one linear input stage is a plurality of linear input stages; and
each of said linear input stages respectively have:
a differential amplifier circuit; and
an overdrive detection circuit for detecting an overdriving of said differential amplifier circuit.

3. The analog/digital converter according to claim 2, wherein said overdrive detection circuit is a window discriminator circuit.

4. The analog/digital converter according to claim 2, wherein said overdrive detection circuit detects a level and an arithmetic sign of an overdriving of said differential amplifier circuit.

5. The analog/digital converter according to claim 1, including a clock generator connected to said acceleration circuit.

6. The analog/digital converter according to claim 1, wherein:
said comparator has a recovery time and a decision time;
a controlled switching device is connected to said register;
said acceleration circuit has:
a pulse generator having an output and generating a pulse at said output;
a first delay element delaying said pulse by a time corresponding to said recovery time of said comparator and outputting said delayed pulse at a first signal output, said first delay element connected to said output of said pulse generator; and
a second delay element delaying said delayed pulse by a time corresponding to said decision time of said comparator, said second delay element connected to said first signal output and having a second signal output;
said first signal output and said second signal output are connected to said switching device; and
said switching device selectively connects said first signal output and said second signal output to said register based upon said at least one overdrive indicator signal.

7. The analog/digital converter according to claim 6, wherein said switching device is a multiplexer.

8. The analog/digital converter according to claim 7, wherein:
said multiplexer has an output;
said pulse generator is a D-type flip-flop; and
said output of said multiplexer is fed back to said D-type flip-flop.

9. The analog/digital converter according to claim 7, wherein:
said multiplexer has an output,
said pulse generator is a D-type flip-flop with at least one input; and
said output of said multiplexer is connected to said at least one input of said D-type flip-flop.

10. The analog/digital converter according to claim 6, wherein said pulse generator is a D-type flip-flop.

11. The analog/digital converter according to claim 6, including a clock generator connected to said acceleration circuit, said pulse generator, said first delay element, and said second delay element being clocked synchronously by said clock generator.

12. The analog/digital converter according to claim 6, wherein:
said acceleration circuit switches said clock signal between:
a first clock signal having a first clock period; and
a second clock signal having a second clock period longer than said first clock period;
said first clock period corresponds to said recovery time;
said second clock period corresponds to said decision time;
said first delay element and said second delay element are connected in series;
said first delay element has a first delay equal to said first clock period; and
said second delay element has a second delay equal to said first clock period and said second clock period.

13. The analog/digital converter according to claim 1, wherein said acceleration circuit switches said clock signal between:
a first clock signal having a first clock period; and
a second clock signal having a second clock period longer than said first clock period.

14. The analog/digital converter according to claim 13, wherein:
said comparator has:
a recovery time with respect to overdriving; and
a decision time;
said first clock period corresponds to said recovery time; and
said second clock period corresponds to said decision time.

15. The analog/digital converter according to claim 1, including a read register connected to said register for reading a digitized final value from said register.

16. A method for converting an analog input signal into a digital output signal, which comprises:
(a) comparing an analog comparison signal to the analog input signal with a comparator having a linear input stage, the analog comparison signal corresponding to a digital value buffer-stored in a clocked successive approximation register;
(b) forming a comparator output signal based upon a result of the comparison to set the buffer-stored digital value in the register;
(c) detecting if the linear input stage of the comparator is overdriven; and
(d) switching a clock signal for the register to:
a first clock signal having a given clock period if overdriving is detected; and
a second clock signal having a clock period longer than the given clock period if no overdriving is detected.

* * * * *